United States Patent

Wimmer

[11] Patent Number: 5,818,706
[45] Date of Patent: Oct. 6, 1998

[54] HIGH-VOLTAGE GENERATOR WITH SHIELDED MEASURING RESISTORS

[75] Inventor: Martin Wimmer, Bad Oldesloe, Germany

[73] Assignee: U.S. Philips Corporation, New York, N.Y.

[21] Appl. No.: 722,648

[22] Filed: Sep. 30, 1996

[30] Foreign Application Priority Data

Sep. 30, 1995 [DE] Germany ................. 195 36 653.0

[51] Int. Cl.⁶ ........................................ H02M 7/10
[52] U.S. Cl. ................................. 363/61; 363/68
[58] Field of Search ............................ 363/52, 53, 54, 363/59, 60, 610, 68, 70, 84, 85, 89

[56] References Cited

U.S. PATENT DOCUMENTS

| | | | |
|---|---|---|---|
| 4,660,138 | 4/1987 | Takamura et al. | 363/61 |
| 4,999,760 | 3/1991 | Tietema | 363/53 |
| 5,008,913 | 4/1991 | Negle | 378/105 |
| 5,703,770 | 12/1997 | Burtin et al. | 363/61 |

FOREIGN PATENT DOCUMENTS

A2156163  6/1990  Japan ............................ G01R 15/04

Primary Examiner—Jeffrey L. Sterrett
Attorney, Agent, or Firm—Jack D. Slobod

[57] ABSTRACT

A high-voltage generator, includes a rectifier circuit (9) and a measuring resistor arrangement (8) for forming a measuring voltage ($U_M$) which is proportional to the direct voltage ($U_{DC}$), the measuring resistor arrangement (8) comprising at least one associated measuring resistor ($R_1$, $R_2$, $R_3$) for each rectifier stage (31, 32, 33). In order to achieve a cost-saving and notably space-saving construction with adequate shielding of the measuring resistors ($R_1$, $R_2$, $R_3$) from parts of the circuit ($C_4 \ldots C_9$, 1, 2, 3) carrying the alternating voltage and from ground potential, the measuring resistors ($R_1$, $R_2$, $R_3$) are integrated in the associated rectifier stages (31, 32, 33) and enclosed by a shield (11, 12, 13) which carries the direct voltage potential of the associated rectifier stage (31, 32, 33).

20 Claims, 3 Drawing Sheets

HIGH-VOLTAGE GENERATOR WITH SHIELDED MEASURING RESISTORS

BACKGROUND OF THE INVENTION

Field of the Invention

The invention relates to a high-voltage generator for generating a direct voltage from an alternating voltage, including a rectifier circuit, having a plurality of rectifier stages, and a measuring resistor arrangement for forming a measuring voltage which is proportional to the direct voltage, the measuring resistor arrangement including at least one associated measuring resistor for each rectifier stage.

A high-voltage generator of this kind is known from JP-A 2-156 163. Therein, the input alternating voltage is stepped up by a transformer having a plurality of secondary windings. With each secondary winding there is associated a rectifier stage which generates a direct voltage from the alternating voltage present across the secondary winding. The rectifier stages are connected in series so that the total output direct voltage of the high-voltage generator is obtained by addition of the individual direct voltages. The measuring resistor arrangement described therein includes a plurality of series-connected measuring resistors as well as a base impedance via which the measuring voltage is derived.

A high-voltage generator for an X-ray tube is known from EP-A 118 147 which corresponds to U.S. Pat. No. 5,008,913. Therein, the measuring resistor arrangement also includes a plurality of measuring resistors as well as a base impedance. The measuring voltage of a few volts must be as proportional as possible to the high voltage in a frequency range of from 0 to some 100 kHz. For electrostatic shielding from the environment, therefore, the measuring resistors are enclosed by a damping resistor which is connected to the high voltage.

In order to avoid the effects of comparatively high stray capacitances and lead inductances of the measuring resistors, which would falsify the measuring voltage, capacitors are connected parallel to the series-connected measuring resistors in the known high-voltage generators. The object is to achieve a large transmission bandwidth. Such compensation capacitors, however, are expensive and require a substantial amount of space.

The output voltage ripple in contemporary high-voltage generators can be kept small by using a high, constant switching frequency (in the range of 20 kHz) during control operations. Consequently, exact measurement of the peak value of the output voltage at high frequencies of a few 100 kHz can be dispensed with, because it is only slightly higher than the mean value of the output voltage and is within the range of permissible deviations, for example in the case of X-ray systems. The limit frequency of the generator for which the frequency behavior of the measuring resistor arrangement must be conceived is dependent on the limit frequency of the closed control loop and is in the range of a few kHz (up to approximately 10 kHz) for these high-voltage generators.

SUMMARY OF THE INVENTION

The present invention has for its object to construct a high-voltage generator of the kind set forth in an economical and space-saving manner.

This object is achieved in accordance with the invention in that the measuring resistors are physically integrated in the associated rectifier stages, that the measuring resistors are enclosed by a conductive shield, carrying direct voltage potential, in order to shield the measuring resistor arrangement from ground potential and from parts of the high-voltage generator carrying alternating voltage, and that the shield carries the direct voltage potential of the associated rectifier stage.

Whereas in the known high-voltage generators the measuring resistor arrangement and the rectifier circuit are arranged so as to be physically separated from one another, now an arrangement is possible in which the measuring resistor arrangement and the rectifier circuit are combined in one construction. Each measuring resistor is arranged in the associated rectifier stage, for example on the same printed circuit board or at a small distance from the side or the top thereof. Each measuring resistor is enclosed by a shield which carries the direct voltage potential of the rectifier stage in which the measuring resistor is integrated. Thus, stray capacitances can no longer occur between the measuring resistors and parts carrying alternating voltage and between the measuring resistors and parts carrying ground potential; via such capacitances the currents could flow in the case of fast variations of the high voltage, thus falsifying the measuring voltage. Because of the shielding of the measuring resistors in the high-voltage generator in accordance with the invention, stray capacitances occur between the shields and parts carrying alternating voltage, or between the shields and ground potential, so that currents no longer flow across the measuring resistors in the case of fast variations of the high voltage and no longer falsify the measuring voltage. Compensation capacitors connected parallel to the individual measuring resistors, as used in the known high-voltage generators, can thus be dispensed with.

The omission of the compensation capacitors already yields a substantial saving in respect of space and costs. Further space is saved by the compact construction in which the measuring resistors are integrated in the construction of the associated rectifier stages. Because each shield enclosing at least one measuring resistor is connected to the direct voltage potential of the associated rectifier stage, very good capacitive decoupling is obtained from the points in the vicinity carrying alternating voltage and also from ground potential and, finally adequate measuring accuracy is achieved in the desired frequency range of up to approximately 10 kHz.

In an embodiment of the invention the measuring resistors are arranged at a distance from the associated rectifier stage and are enclosed by a thin metal sheet which acts as a shield. The distance of the measuring resistor need then be only one or a few centimeters. A simple and inexpensive metal sheet can already act as a suitable shield. In a preferred embodiment of the invention, the rectifier circuit is a high-voltage cascade composed of capacitors and diodes. A high-voltage cascade for voltage multiplication in an X-ray device is known, for example from EP-B 198 741. The integration of the measuring resistors in the rectifier stages of the high-voltage cascade in the high-voltage generator in accordance with the invention yields a significant saving in respect of space in comparison with customary high-voltage generators in which the measuring resistor arrangement with the measuring resistors and the high-voltage cascade are physically separately arranged, for example on two large printed circuit boards.

In a further embodiment of the invention the shield consists of an U-shaped sheet which shields the measuring resistor at the sides from the capacitors of the high-voltage cascade which carry the alternating voltage. The shielding sheet, carrying the potential of the associated rectifier stage of the high-voltage cascade, enables arrangement of the measuring resistor at a small distance from the capacitors, for example directly on the printed circuit board or at a small distance above the printed circuit board. The U-shaped sheet should then be arranged so that its limb surfaces are situated between the capacitors and the measuring resistor.

In an embodiment of the invention in which a particularly large amount of space is saved, the rectifier circuit and the measuring resistor arrangement are accommodated on a single printed circuit board. The high-voltage generator in accordance with the invention then has a low height and a small volume in comparison with prior-art high-voltage generators.

Because of the shielding of the measuring resistors in the high-voltage generator in accordance with the invention, stray capacitances no longer occur between the measuring resistors and the ground potential or between the measuring resistors and parts carrying alternating voltage, via which alternating currents flow which could hence falsify the measuring signal. Considering the foregoing properties, the high-voltage generator in accordance with the invention is suitable for operating a tube, notably a picture tube or an X-ray tube in an X-ray system.

BRIEF DESCRIPTION OF THE DRAWING

The invention will be described in detail hereinafter with reference to the drawing. Therein.

DESCRIPTION OF THE PREFERRED EMBODIMENTS

Figure 1:
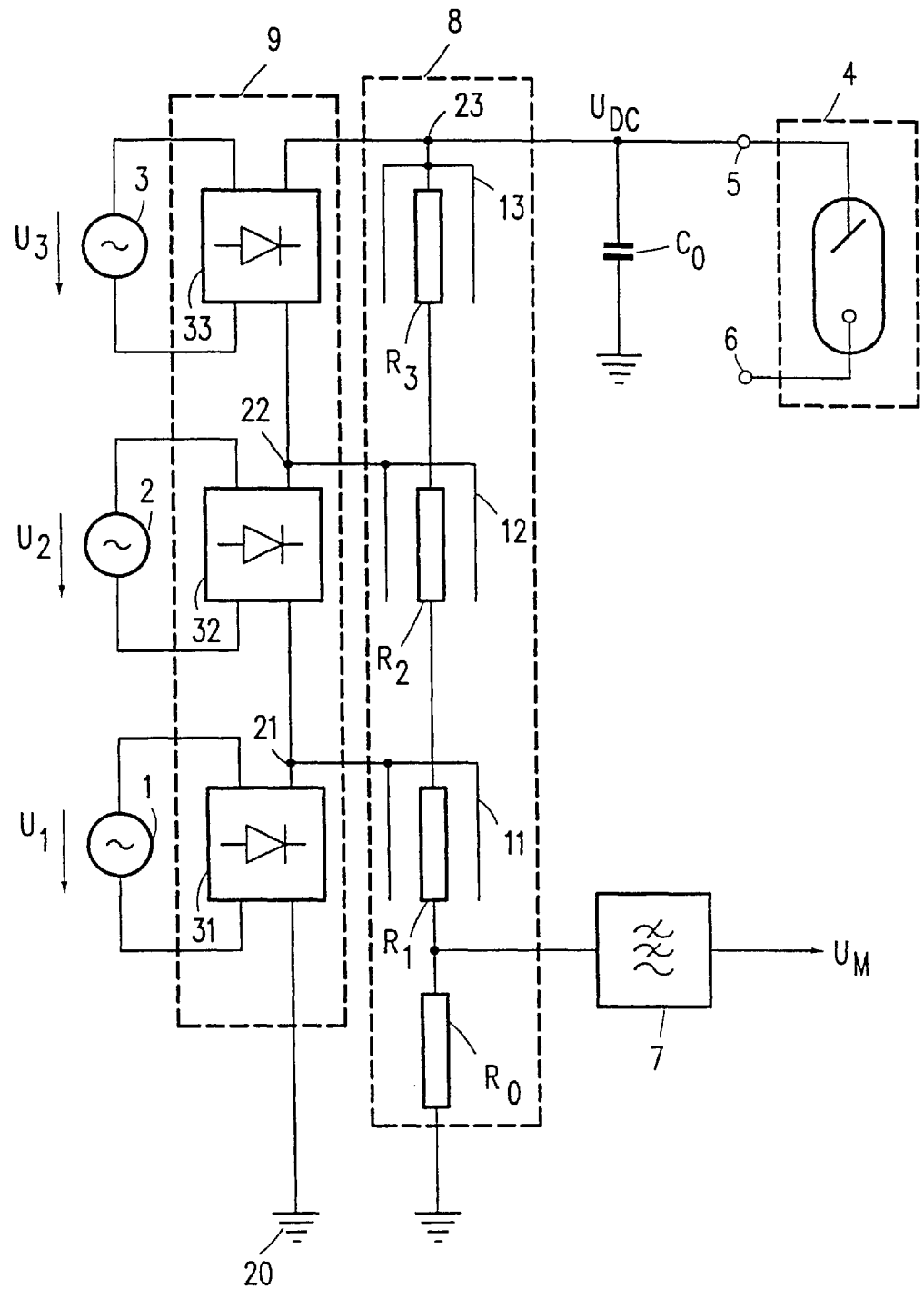
FIG. 1 shows a circuit diagram of a high-voltage generator in accordance with the invention for an X-ray tube.

FIG. 1 shows the circuit diagram of a high-voltage generator in accordance with the invention for an X-ray tube, comprising three alternating voltage sources 1, 2, 3. The voltages $U_1$, $U_2$, $U_3$ thereof are applied to a rectifier circuit 9, for each alternating voltage source 1, 2, 3 there being provided a respective rectifier stage 31, 32, 33 which transforms the relevant alternating voltage $U_1$, $U_2$, $U_3$ into a direct voltage. The rectifier stages 31, 32, 33 are connected in series so that a direct voltage $U_{DC}$ can be derived from the output of the high-voltage generator, which direct voltage corresponds to the sum of the output direct voltages of the rectifier stages 31, 32, 33. The high voltage $U_{DC}$ serves to feed an X-ray tube 4, the output of the high-voltage generator shown being connected to the anode terminal 5 of the X-ray tube 4. The cathode terminal 6 is connected to a further high-voltage generator (not shown) which generates a negative direct voltage. Furthermore, a smoothing capacitor $C_0$ for smoothing the output voltage $U_{DC}$ is connected to ground at the output 23 of the high-voltage generator.

A measuring resistor arrangement 8 is connected parallel to the smoothing capacitor $C_0$ at the output 23 of the high-voltage generator. The measuring resistor arrangement 8 includes for each rectifier stage 31, 32, 33 a measuring resistor $R_1$, $R_2$, $R_3$ as well as a base impedance $R_0$ which are series-connected to ground 20. The measuring resistors $R_1$, $R_2$, $R_3$ have the same value, being from approximately 1,000 to 10,000 times higher than the resistance of the base impedance $R_0$. Via a low-pass filter 7, the desired measuring voltage $U_M$ is derived between the lowermost measuring resistor $R_1$ and the base impedance $R_0$; because of the proportioning of the resistors this measuring voltage corresponds to a small part of and is proportional to the high voltage $U_{DC}$.

The measuring resistors $R_1$, $R_2$, $R_3$ are enclosed by a respective conductive shield 11, 12, 13, each shield carrying the output potential of the associated rectifier stage 31, 32, 33. For example, to this end the shield 11 enclosing the measuring resistor $R_1$ is connected to the output potential of the rectifier stage 31 at point 21. Similarly, at point 22 the shield 12 is connected to the output of the rectifier stage 32., whereas at point 23 the shield 13 is connected to the output of the rectifier stage 33. This shielding ensures that the measuring resistors $R_1$, $R_2$, $R_3$ are capacitively decoupled on the one side from the parts of the high-voltage generator carrying the alternating voltage, i.e. the alternating voltage sources 1, 2, 3, as well as from the inputs of the rectifier stages 31, 32, 33. On the other hand, the measuring resistors $R_1$, $R_2$, $R_3$ are also capacitively decoupled from ground potential 20. The bandwidth of the measuring resistor arrangement extends as far as the limit frequency of the high-voltage generator, which limit frequency is dependent on the switching frequency during control operations of the generator and amounts to a few kHz. The shielding shown does not suffice for exact representation also of RF output voltage fluctuations (>20 kHz) in the measuring signal $U_M$, but this is not necessary when use is made of contemporary high-voltage generators in which the peak value of the output voltage fluctuation does not exceed 2% of the average value of the output voltage. Therefore, and because of the adequate shielding of the measuring resistors, it is not necessary to use compensation capacitors, as described in EP-A-118147, connected parallel to the measuring resistors $R_1$, $R_2$, $R_3$. This offers a significant cost saving because of the limited number of components of the measuring resistor arrangement, as well as a large saving in space as a result of the compact construction.

Figure 2:
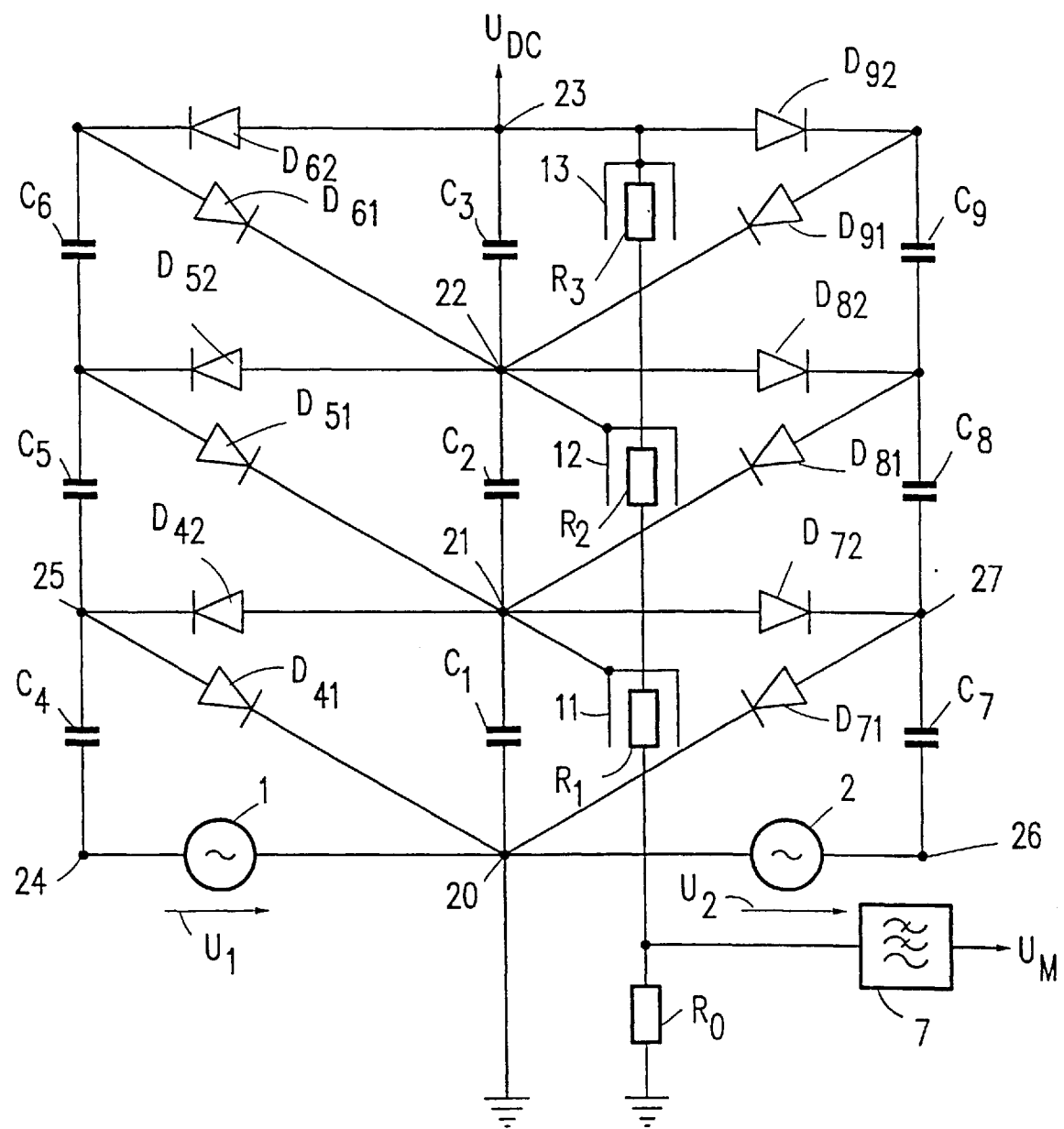
FIG. 2 shows a further circuit diagram of a high-voltage generator in accordance with the invention which comprises a high-voltage cascade.

FIG. 2 shows the circuit diagram of a high-voltage generator in accordance with the invention provided with a high-voltage cascade. The high-voltage cascade, transforming the alternating voltages $U_1$ and $U_2$ from the alternating voltage sources 1 and 2, respectively, into an output direct voltage $U_{DC}$ amounting to at the most six times the peak voltage of the alternating voltage sources 1, 2, consists of three series-connected two-way doubling stages. Each of these two-way doubling stages consists of two shifting capacitors $C_4$ ... $C_9$, a smoothing capacitor $C_1$ ... $C_3$, as well as four diodes $D_{41}$, $D_{42}$, $D_{51}$ ... $D_{92}$. For example, the first two-way doubling stage comprises the shifting capacitor $C_4$ whose first terminal 24 is connected to the alternating voltage source 1 and whose second terminal 25 is connected to the two diodes $D_{41}$ and $D_{42}$. The second terminals of the two diodes $D_{41}$, and $D_{42}$ are connected to a respective connection point 20, 21 of the smoothing capacitor $C_1$, the connection point 20 being connected to ground. Mirrored with respect to the smoothing capacitor $C_1$, the second part of the first two-way stage comprises the shifting capacitor $C_7$ and the two diodes $D_{71}$, and $D_{72}$. The second two-way doubling stage, and subsequently the third two-way doubling stage of the same construction, is connected to the terminals 21, 25 and 27. The output direct voltage $U_{DC}$ is present at the upper terminal 23 of the smoothing capacitor $C_3$ of the third two-way doubling stage. The operation and the exact construction of a high-voltage cascade thus constructed is known, for example from EP-B 198 741 and, therefore, need not be elaborated herein.

To the output 23 of the high-voltage cascade there is connected the series connection of the measuring resistors $R_1, R_2, R_3$ which is terminated to ground by way of the base impedance $R_0$ via which the measuring voltage $U_M$ is derived by way of a low-pass filter 7. Each of the measuring resistors $R_1, R_2, R_3$ is enclosed by a respective conductive shield 11, 12, 13, each shield 11, 12, 13 carrying the output direct voltage of the associated doubling stage. To this end, the shield 11 is connected to the point 21, the shield 12 to the point 22 and the shield 13 to the point 23. The decoupling of the measuring resistor arrangement from ground potential and the points carrying alternating voltage, notably the shifting capacitors $C_4 \ldots C_9$ of the high-voltage cascade, as already described with reference to FIG. 1, is thus achieved again.

Figure 3:
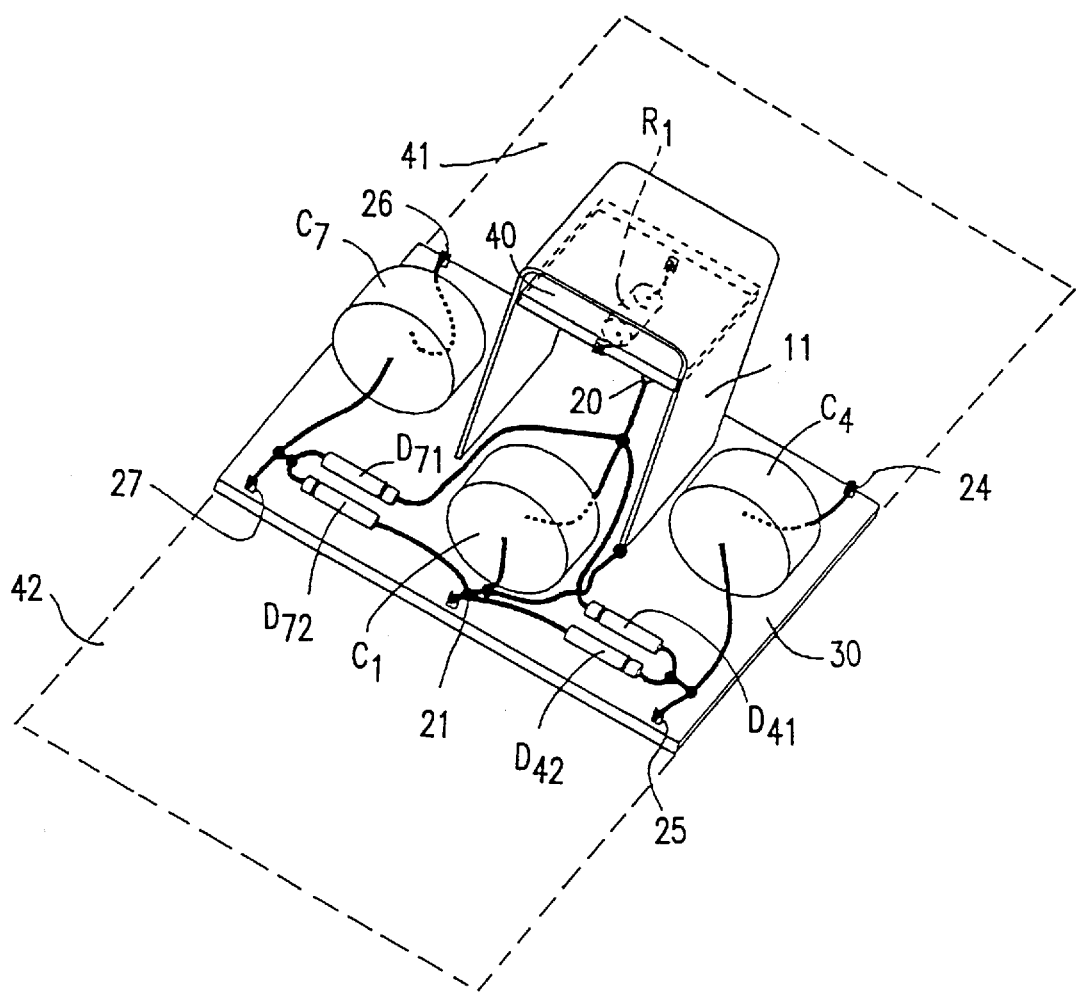
FIG. 3 shows a detail of the mechanical construction of the circuit shown in FIG. 2.

FIG. 3 shows the mechanical construction of the first two-way doubling stage of the high-voltage generator of FIG. 2. At the center of a printed circuit board 30 there is arranged the smoothing capacitor $C_1$ and the power capacitors $C_4$ and $C_7$ are provided at a respective side. The diodes $D_{41}$ and $D_{42}$, $D_{71}$ and $D_{72}$ are connected to the terminals 25 and 27, respectively, the diodes $D_{41}$ and $D_{71}$ being joined at the terminal 20 and the diodes $D_{42}$ and $D_{72}$ at the terminal 21. At some distance above the printed circuit board 30, between the shifting capacitors $C_4$ and $C_7$, the measuring resistor $R_1$ associated with this two-way doubling stage is arranged on a small printed circuit board 40. The printed circuit board 40 is enclosed by a thin metallic sheet 11 which also serves to mount the printed circuit board 40. The sheet 11 is mounted on the printed circuit board 30, is bent as a U turned upside down, and is conductively connected to the point 21 in order to shield the measuring resistor $R_1$ at the sides from the shifting capacitors $C_4$ and $C_7$, carrying the alternating voltage, as well as from the ground potential above, being present at a small distance above such an arrangement in a practical construction of an X-ray generator which comprises a grounded cover plate at that level.

As is indicated by the dashed boxes 41 and 42 in FIG. 3, the construction of the circuit shown in FIG. 2 is obtained by linking three constructions as shown in FIG. 3. The two-way doubling stages may be provided on a respective printed circuit board, said printed circuit boards subsequently being connected together, or be mounted on a single printed circuit board. The height dimensions of such a construction are substantially smaller than the dimensions in the transverse and the longitudinal direction. Because of the integration of the measuring resistor arrangement in the construction of the high-voltage cascade, this construction requires significantly less space than the known arrangement. Savings in respect of costs and space are also obtained because no parallel connected high-voltage compensation capacitors are required parallel to the measuring resistors.

The construction of the high-voltage cascade is not relevant to the invention. The invention could also be used for other high-voltage generators, for example a power generator including a transformer. A rectifier stage may be associated not only with a respective measuring resistor, but also with a plurality of measuring resistors, the measuring resistors associated with a rectifier stage then being enclosed by a common shield.

The invention can be used wherever it is necessary to measure a direct voltage on which an alternating voltage is superposed because of switching operations, for example the generation of a direct voltage in X-ray tubes, in X-ray image intensifiers, monitors, television display screens, vacuum tube power supplies and mains power supplies.

I claim:

1. A high-voltage generator for generating a direct voltage from a plurality of alternating voltages, including a rectifier circuit, having a plurality of rectifier stages for rectifying the plurality of alternating voltages, and a measuring resistor arrangement for forming a measuring voltage which is proportional to the direct voltage, the measuring resistor arrangement including at least one associated measuring resistor for each rectifier stage, characterized in that the measuring resistors are physically integrated in the associated rectifier stages, that the measuring resistors are each enclosed by a respective conductive shield carrying direct voltage potential in order to shield the measuring resistor arrangement from ground potential and from parts of the high-voltage generator carrying alternating voltage, and that the shield carries the direct voltage potential of the associated rectifier stage.

2. A high-voltage generator as claimed in claim 1, characterized in that the measuring resistors are arranged at a distance from the associated rectifier stages and are enclosed by a respective thin metal sheet which acts as the shield.

3. A high-voltage generator as claimed in claim 2, characterized in that the rectifier circuit and the measuring resistor arrangement are accommodated on a single printed circuit board.

4. An X-ray generator including a high-voltage generator as claimed in claim 3.

5. An X-ray generator including a high-voltage generator as claimed in claim 2.

6. An X-ray system including an X-ray generator as claimed in claim 5.

7. A high-voltage generator as claimed in claim 1, characterized in that the rectifier circuit is a high-voltage cascade composed of capacitors and diodes.

8. An X-ray generator including a high-voltage generator as claimed in claim 7.

9. An X-ray system including an X-ray generator as claimed in claim 8.

10. A high-voltage generator as claimed in claim 7, characterized in that the rectifier circuit and the measuring resistor arrangement are accommodated on a single printed circuit board.

11. A high-voltage generator as claimed in claim 7, characterized in that the shield consists of a U-shaped sheet which shields the measuring resistor at the sides from the capacitors of the high-voltage cascade which carry the alternating voltage.

12. A high-voltage generator as claimed in claim 11, characterized in that the rectifier circuit and the measuring resistor arrangement are accommodated on a single printed circuit board.

13. An X-ray generator including a high-voltage generator as claimed in claim 12.

14. An X-ray generator including a high-voltage generator as claimed in claim 11.

15. An X-ray system including an X-ray generator as claimed in claim 14.

16. A high-voltage generator as claimed in claim 1, characterized in that the rectifier circuit and the measuring resistor arrangement are accommodated on a single printed circuit board.

17. An X-ray generator including a high-voltage generator as claimed in claim 16.

18. An X-ray system including an X-ray generator as claimed in claim 17.

19. An X-ray generator including a high-voltage generator as claimed in claim 1.

20. An X-ray system including an X-ray generator as claimed in claim 19.

* * * * *